United States Patent
Kuo

(10) Patent No.: US 9,478,499 B2
(45) Date of Patent: Oct. 25, 2016

(54) SEMICONDUCTOR PACKAGE STRUCTURE AND METHOD FOR MANUFACTURING THE SAME

(71) Applicant: United Microelectronics Corp., Hsinchu (TW)

(72) Inventor: Chien-Li Kuo, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/479,526

(22) Filed: Sep. 8, 2014

(65) Prior Publication Data

US 2016/0020175 A1  Jan. 21, 2016

(30) Foreign Application Priority Data

Jul. 17, 2014  (CN) .......................... 2014 1 0341647

(51) Int. Cl.
| | |
|---|---|
| *H01L 29/40* | (2006.01) |
| *H01L 23/48* | (2006.01) |
| *H01L 23/04* | (2006.01) |
| *H01L 23/538* | (2006.01) |
| *H01L 21/56* | (2006.01) |
| *H01L 21/78* | (2006.01) |
| *H01L 25/065* | (2006.01) |
| *H01L 23/00* | (2006.01) |
| *H01L 23/31* | (2006.01) |

(52) U.S. Cl.
CPC ......... *H01L 23/5389* (2013.01); *H01L 21/561* (2013.01); *H01L 21/78* (2013.01); *H01L 24/97* (2013.01); *H01L 25/065* (2013.01); *H01L 23/3128* (2013.01); *H01L 2224/16225* (2013.01); *H01L 2224/32145* (2013.01); *H01L 2224/32225* (2013.01); *H01L 2224/48227* (2013.01); *H01L 2224/48228* (2013.01); *H01L 2224/73265* (2013.01); *H01L 2924/15311* (2013.01); *H01L 2924/18161* (2013.01)

(58) Field of Classification Search
CPC ................. H01L 23/52; H01L 2924/013222; H01L 2924/181; H01L 23/5389; H01L 21/76877; H01L 24/97; H01L 2224/73265; H01L 2924/15311; H01L 2924/18161
USPC .......... 257/783, 668, 704, 81, 774; 438/109, 438/107, 108
See application file for complete search history.

(56) References Cited

U.S. PATENT DOCUMENTS

| | | |
|---|---|---|
| 8,378,480 B2 | 2/2013 | Chen et al. |
| 8,455,300 B2 | 6/2013 | Chi et al. |
| 2003/0134455 A1* | 7/2003 | Cheng ................ H01L 23/13 438/125 |
| 2007/0210423 A1* | 9/2007 | Hsu .................... H01L 23/5389 257/668 |

(Continued)

OTHER PUBLICATIONS

Minho Kim, "High Performance & Low Power Memory Trend", Power Point Presentation, slides 1-19, presented in SEMICON® West, Jul. 2013.

*Primary Examiner* — Dzung Tran
(74) *Attorney, Agent, or Firm* — WPAT, PC; Justin King

(57) ABSTRACT

A semiconductor package structure and a method for manufacturing the same are provided. The semiconductor package structure has a substrate and a die stack of n die(s), wherein n≥1. The substrate has a first side, a second side and an opening extending from the first side to the second side. The die stack is disposed in the opening. The thickness of the substrate is substantially the same as the thickness of the die stack.

8 Claims, 4 Drawing Sheets

(56) References Cited

U.S. PATENT DOCUMENTS

| | | | |
|---|---|---|---|
| 2008/0116584 A1* | 5/2008 | Sitaram | H01L 24/02 257/668 |
| 2009/0321948 A1* | 12/2009 | Wang | H01L 24/33 257/777 |
| 2010/0078655 A1* | 4/2010 | Yang | H01L 23/49816 257/81 |
| 2010/0207262 A1* | 8/2010 | Park | H01L 21/565 257/686 |
| 2012/0068359 A1* | 3/2012 | Mori | H01L 23/49827 257/774 |

* cited by examiner

SEMICONDUCTOR PACKAGE STRUCTURE AND METHOD FOR MANUFACTURING THE SAME

This application claims the benefit of People's Republic of China application Serial No. 201410341647.0, filed Jul. 17, 2014, the subject matter of which is incorporated herein by reference.

BACKGROUND

1. Technical Field

The disclosure relates to a semiconductor package structure and a method for manufacturing the same. More particularly, the disclosure relates to a thinned semiconductor package structure and a method for manufacturing the same.

2. Description of the Related Art

During the development of the consumer electronics such as mobile phones and the like, higher performance, higher power efficiency, larger density and lower thickness have been pursued all the time. Among these goals, the thickness decreasing issue has been limited by the thickness of the electronic components in the consumer electronics. For example, for an application processor or a DRAM having a package-on-package structure, the lowest thickness may be the sum of the thickness of the two stacked packages, wherein the thickness of each package typically equals to the sum of the thickness of the substrate and the thickness of the die/dies formed thereon.

SUMMARY

In this disclosure, a thinned semiconductor package structure and a method for manufacturing the same are provided.

According to some embodiment, the semiconductor package structure comprises a substrate and a die stack of n die(s), wherein n≥1. The substrate has a first side, a second side and an opening extending from the first side to the second side. The die stack is disposed in the opening. The thickness of the substrate is substantially the same as the thickness of the die stack.

According to some embodiment, the method for manufacturing a semiconductor package structure comprises the following steps. First, a substrate is attached to a carrier. The substrate has a first side, a second side and an opening extending from the first side to the second side. Then, a die stack of n die(s) is attached to the carrier through the opening, wherein n≥1. The thickness of the substrate is substantially the same as the thickness of the die stack.

Figure 1A:
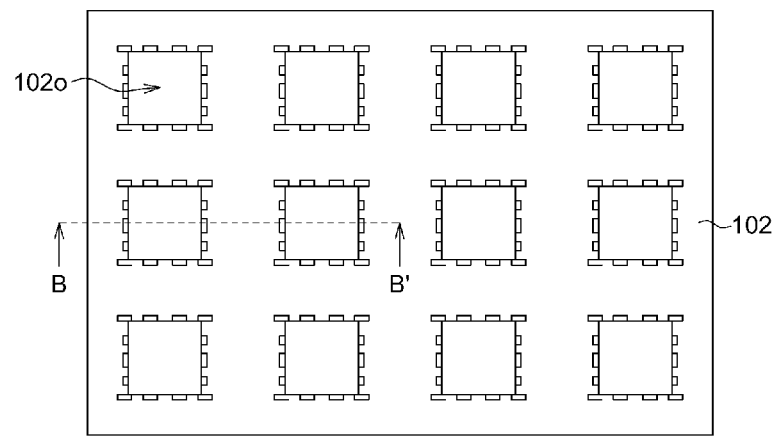
FIG. 1A-FIG. 9 schematically illustrate a method for manufacturing a semiconductor package structure according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Now the description is directed to said semiconductor package structure and a method for manufacturing the same.

FIG. 1A-FIG. 9 schematically illustrate a method for manufacturing said semiconductor package structure according to one embodiment. For clarity, parts of the elements may be removed from the drawings.

Figure 1B:
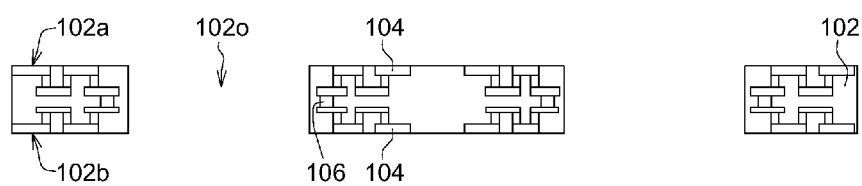

Referring to FIGS. 1A and 1B, a substrate 102 is provided. FIG. 1A show the top view of the substrate 102, and FIG. 1B shows a cross-sectional view of the substrate 102 taken from the line B-B' shown in FIG. 1A. The substrate 102 has a first side 102a, a second side 102b and an opening 102o extending from the first side 102a to the second side 102b. The substrate 102 may be a wafer or a panel. In some example, the substrate 102 comprises Si, glass or the like. The substrate 102 may comprise redistribution layers 104 and via 106 connecting the redistribution layers 104. The redistribution layers 104 may be formed of Cu, Al, W or composition thereof.

Figure 2:
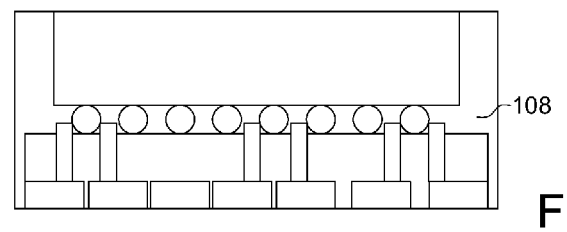

Referring to FIG. 2, a die stack 108 of n die(s) is provided, wherein n≥1. In the example of FIG. 2, two dies are shown to compose a die stack 108. All or part of the dies of the die stack 108 may be the same, or all of the dies of the die stack 108 may be different. In other examples, only one die or more than two dies may be comprised in the die stack 108. In some examples, one or more dies in the die stack 108 comprise through silicon vias (TSVs).

Here, the thickness of the substrate 102 or the thickness of the die(s) of the die stack 108 may be adjusted such that the thickness of the substrate 102 is substantially the same as the thickness of the die stack 108. For example, the thickness of the die(s) may be adjusted by being thinned from the back surface (i.e. the surface opposite to the surface having the integrated circuits and interconnects).

Figure 3:
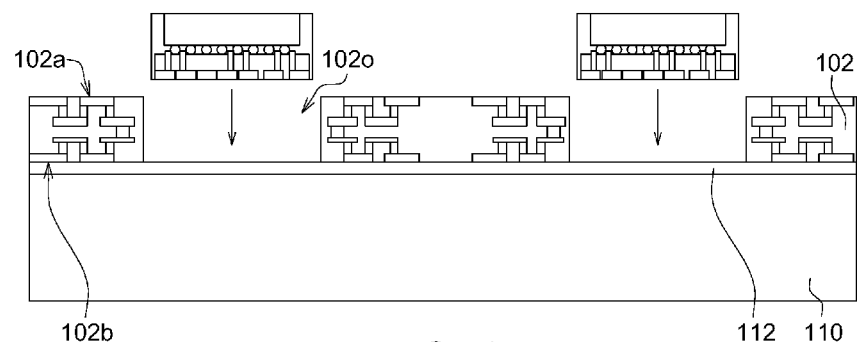

Referring to FIG. 3, first, the substrate 102 is attached to a carrier 110. Then, the die stack 108 is attached to the carrier 110 through the opening 102o of the substrate 102. In some examples, an alignment step may be optionally carried out. The substrate 102 and the die stack 108 may be temporarily mounted on the carrier 110 by an adhesive layer 112. Here, the thickness of the substrate 102 is substantially the same as the thickness of the die stack 108.

Figure 4:
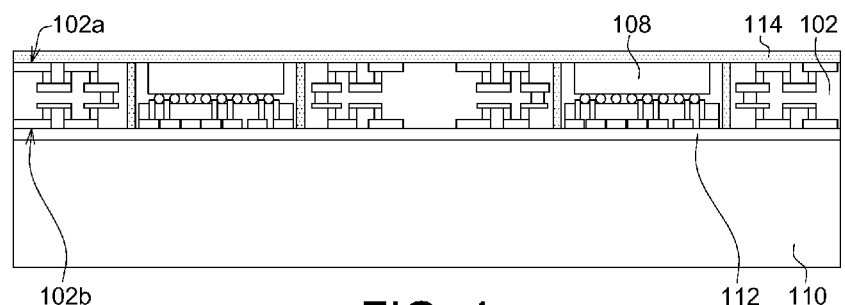

Referring to FIG. 4, a first adhesive insulating layer 114 may be formed on the first side 102a of the substrate 102 and between the substrate 102 and the die stack 108. The first adhesive insulating layer 114 may comprise a light-sensitive adhesive, such as benzocyclobutene (BCB), polybenzoxazole (PBO) or the like. The first adhesive insulating layer 114 may provide electrical insulation to the circuit layer(s) (such as first circuit layers 118 and 122) formed in the following steps. The first adhesive insulating layer 114 may be patterned.

Figure 5:
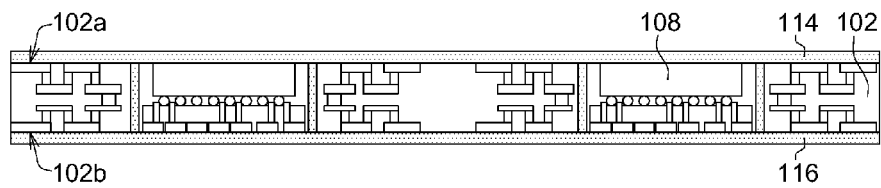

Referring to FIG. 5, the carrier 110 is removed. Then, a second adhesive insulating layer 116 may be formed on the second side 102b of the substrate 102. The second adhesive insulating layer 116 may comprise the same material as the first adhesive insulating layer 114, such as a light-sensitive adhesive. The second adhesive insulating layer 116 may provide electrical insulation to the circuit layer(s) (such as second circuit layers 120 and 124) formed in the following steps. The second adhesive insulating layer 116 may be patterned.

Figure 6:
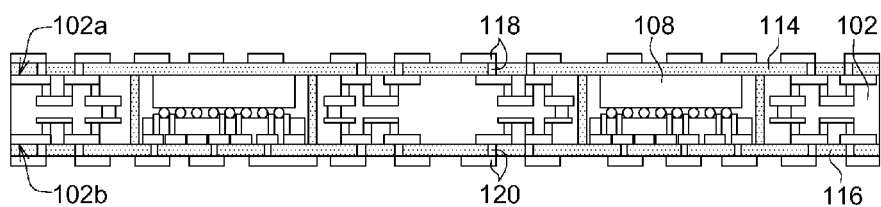

Referring to FIG. 6, a first circuit layer 118 may be formed on the first side 102a of the substrate 102, and a second circuit layer 120 may be formed on the second side 102b of the substrate 102. The first circuit layer 118 and the second circuit layer 120 may be formed by semi-additive metallization process. The semi-additive metallization process may exemplarily comprise: forming openings in an insulating layer, such as the first adhesive insulating layer 114 or the second adhesive insulating layer 116, (see the description with respect to FIG. 5); forming a thin conformal metal layer on the surface of the insulating layer and on the sidewalls and bottoms of the openings such as by electroless plating process; forming a patterned photo resist on the insulating layer, wherein the exposed region is the region where metal lines to be formed; plating the exposed region to form the metal lines and filling the openings in the insulating layer; removing the patterned photo resist; and removing the thin conformal metal layer that had been covered by the patterned photo resist.

Figure 7:
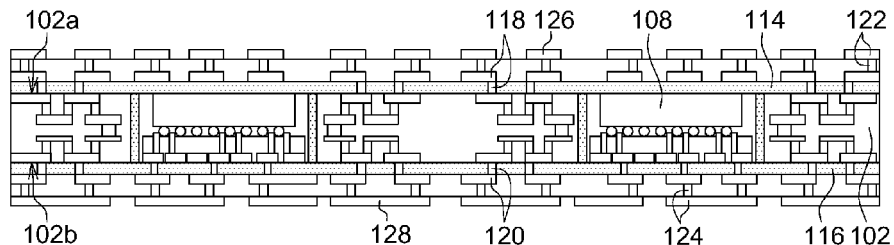

Referring to FIG. 7, another first circuit layer 122 may be formed on the first circuit layer 118, and another second circuit layer 124 may be formed on the second circuit layer 120. The first circuit layer 122 and the second circuit layer 124 may be formed by semi-additive metallization process. The first circuit layer 122 comprises pads 126. The second circuit layer 124 comprises pads 128.

Figure 8:
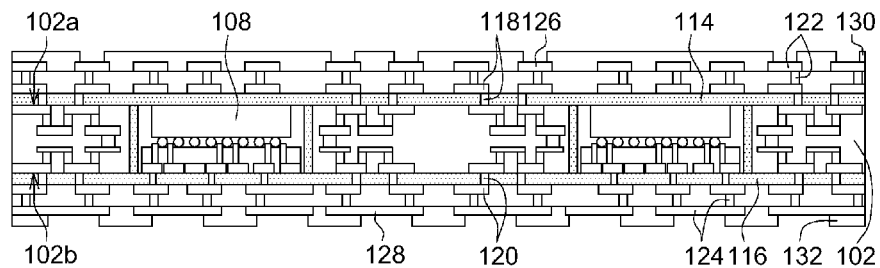

Referring to FIG. 8, a first passivation layer 130 may be formed on the first circuit layer 122, and a second passivation layer 132 may be formed on the second circuit layer 124. The first passivation layer 130 exposes the pads 126 of the first circuit layer 122. The second passivation layer 132 exposes the pads 128 of the second circuit layer 124.

Figure 9:
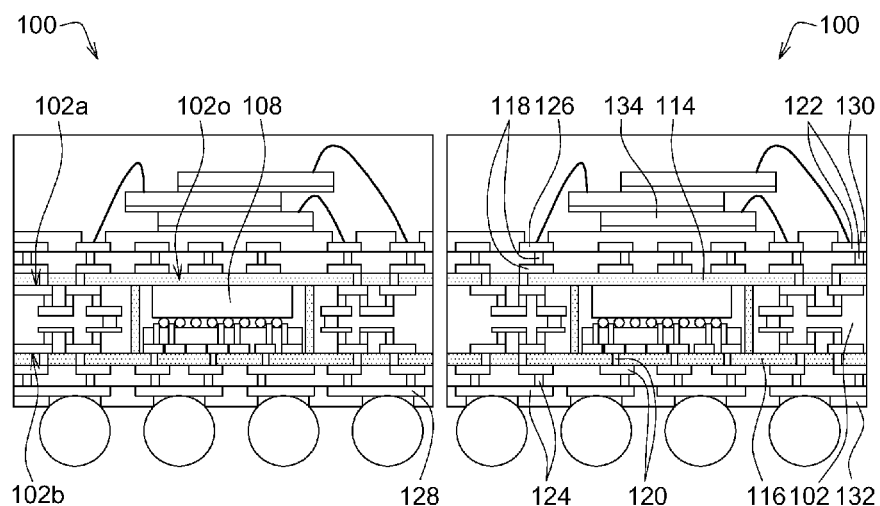

Referring to FIG. 9, a die 134 may be provided on the first passivation layer 130. In the example of FIG. 9, three dies 134 are exemplarily provided. The die 134 is electrically connected to the pads 126 of the first circuit layer 122. The die 134 may be electrically connected to the pads 126 of the first circuit layer 122 by wire bonding, ball grid array (BGA) bonding, flip chip bonding or the like. In the example of FIG. 9, the die 134 and the pads 126 are connected by wire bonding. In the example of FIG. 9, solder balls is formed on the pads 128 of the second circuit layer 124 for electrical connection. However, other connecting method, such as flip chip bonding, may be used.

Then, a step of cutting the substrate 102 may be carried out for singulation. It is to be noted that the cutting step may be incorporated into any steps after the formation of the first adhesive insulating layer 114.

Through the method described above, the die stack 108 is disposed in the opening 102o of the substrate 102. In addition, the thickness of the substrate 102 is adjusted to be substantially the same as the die stack 108. As such, the thickness may be further decreased. The decreased thickness equals to at least the thickness of a substrate. Compared to a conventional package on package structure, a package on package structure formed by the above method may be about 200 um thinner.

A semiconductor package structure 100 formed by the above method comprises a substrate 102 and a die stack 108 of n die(s), wherein n≥1. The substrate 102 has a first side 102a, a second side 102b and an opening 102o extending from the first side 102a to the second side 102b. The substrate 102 may be a wafer or a panel. In some example, the substrate 102 comprises Si, glass or the like. In some example, one of the n dies is different from another one of the n dies. The die stack 108 is disposed in the opening 102o. The thickness of the substrate 102 is substantially the same as the thickness of the die stack 108.

The semiconductor package structure 100 may further comprise a first adhesive insulating layer 114 and a second adhesive insulating layer 116. The first adhesive insulating layer 114 is disposed on the first side 102a of the substrate 102 and between the substrate 102 and the die stack 108. The second adhesive insulating layer 116 is disposed on the second side 102b of the substrate 102. The first adhesive insulating layer 114 and the second adhesive insulating layer 116 may comprise a light-sensitive adhesive, such as BCB, PBO or the like.

The semiconductor package structure 100 may further comprise at least one first circuit layer 118/122 and at least one second circuit layer 120/124. The at least one first circuit layer 118/122 is disposed on the first side 102a of the substrate 102. The at least one first circuit layer 118/122 comprises pads 126. The at least one second circuit layer 120/124 is disposed on the second side 102b of the substrate 102. The at least one second circuit layer 120/124 comprises pads 128.

The semiconductor package structure 100 may further comprise a first passivation layer 130 and a second passivation layer 132. The first passivation layer 130 is disposed on the at least one first circuit layer 118/122. The first passivation layer 130 exposes the pads 126 of the at least one first circuit layer 118/122. The second passivation layer 132 is disposed on the at least one second circuit layer 120/124. The second passivation layer 132 exposes the pads 128 of the at least one second circuit layer 120/124.

The semiconductor package structure 100 may further comprise a die 134. The die 134 is disposed on the first passivation layer 130 and electrically connected to the pads 126 of the at least one first circuit layer 118/122. The die 134 may be electrically connected to the pads 126 by wire bonding, ball grid array bonding, flip chip bonding or the like. In some examples, solder balls may be formed on the pads 128 for electrical connection. In other examples, other connecting method, such as flip chip bonding, may be used.

In this embodiment, since the die stack 108 is disposed in the opening 102o of the substrate 102 and the thickness of the substrate 102 is adjusted to be substantially the same as the die stack 108, the thickness may be further decreased. As described above, compared to a conventional package on package, the semiconductor package structure 100 may be about 200 um thinner.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor package structure, comprising:
   a substrate having a first side, a second side and an opening extending from the first side to the second side, wherein the substrate comprises a redistribution layer and a via; and
   a die stack of n die(s) disposed in the opening, wherein n≥1;
   wherein the thickness of the substrate is substantially the same as the thickness of the die stack, and the redistribution layer and the via do not overlap with the die stack in a top view.

2. The semiconductor package structure according to claim 1, wherein the substrate is a wafer or a panel.

3. The semiconductor package structure according to claim 1, wherein one of the n dies is different from another one of the n dies.

4. The semiconductor package structure according to claim 1, further comprising:
   a first adhesive insulating layer disposed on the first side of the substrate and between the substrate and the die stack; and
   a second adhesive insulating layer disposed on the second side of the substrate.

5. The semiconductor package structure according to claim 4, wherein the first adhesive insulating layer and the second adhesive insulating layer comprise a light-sensitive adhesive.

6. The semiconductor package structure according to claim 4, further comprising:
   at least one first circuit layer disposed on the first side of the substrate, the at least one first circuit layer comprising pads; and
   at least one second circuit layer disposed on the second side of the substrate, the at least one second circuit layer comprising pads.

7. The semiconductor package structure according to claim 6, further comprising:
   a first passivation layer disposed on the at least one first circuit layer, the first passivation layer exposing the pads of the at least one first circuit layer; and
   a second passivation layer disposed on the at least one second circuit layer, the second passivation layer exposing the pads of the at least one second circuit layer.

8. The semiconductor package structure according to claim 7, further comprising:
   a die disposed on the first passivation layer and electrically connected to the pads of the at least one first circuit layer.

* * * * *